US012598728B2

(12) United States Patent
Tricas et al.

(10) Patent No.: US 12,598,728 B2
(45) Date of Patent: Apr. 7, 2026

(54) SELF-ADAPTIVE THIN-FILM ELECTROMAGNETIC SHIELDING SCREEN

(71) Applicants: CENTRE NATIONAL DE LA RECHERCHE SCIENTIFIQUE, Paris (FR); UNIVERSITE DE RENNES, Rennes (FR); SAFRAN ELECTRONICS & DEFENSE, Paris (FR)

(72) Inventors: Quentin Tricas, Moissy-Cramayel (FR); Patrice Foutrel, Moissy-Cramayel (FR); Xavier Castel, Rennes (FR); Claire Le Paven, Rennes (FR); Philippe Besnier, Paris (FR)

(73) Assignees: CENTRE NATIONAL DE LA RECHERCHE SCIENTIFIQUE, Paris (FR); UNIVERSITE DE RENNES, Rennes (FR); SAFRAN ELECTRONICS & DEFENSE, Paris (FR)

( * ) Notice: Subject to any disclaimer, the term of this patent is extended or adjusted under 35 U.S.C. 154(b) by 225 days.

(21) Appl. No.: 18/705,074

(22) PCT Filed: Oct. 28, 2022

(86) PCT No.: PCT/FR2022/052048
§ 371 (c)(1),
(2) Date: Apr. 26, 2024

(87) PCT Pub. No.: WO2023/073327
PCT Pub. Date: May 4, 2023

(65) Prior Publication Data
US 2024/0431082 A1 Dec. 26, 2024

(30) Foreign Application Priority Data
Oct. 28, 2021 (FR) ..................................... 2111517

(51) Int. Cl.
*H05K 9/00* (2006.01)

(52) U.S. Cl.
CPC ......... *H05K 9/0058* (2013.01); *H05K 9/0005* (2013.01); *H05K 9/0049* (2013.01); *H05K 9/0086* (2013.01); *H05K 9/0094* (2013.01)

(58) Field of Classification Search
CPC ... H05K 9/0094; H05K 9/0005; H05K 9/0086
See application file for complete search history.

(56) References Cited

U.S. PATENT DOCUMENTS

2017/0150659 A1* 5/2017 Uprety ................. H05K 9/0094
2018/0003364 A1* 1/2018 Wheatley .......... G02F 1/133504
(Continued)

FOREIGN PATENT DOCUMENTS

FR          3 120 697 A1      9/2022
JP          2001-210990 A     8/2001
WO          2018/215243 A1    11/2018

OTHER PUBLICATIONS

Holloway et al., "Shielding Effectiveness Measurements of Materials Using Nested Reverberation Chambers," IEEE Trans. Electromagn. Compat., May 2003, pp. 350-356, vol. 45, No. 2.
(Continued)

*Primary Examiner* — Hung V Ngo
(74) *Attorney, Agent, or Firm* — CHRISTENSEN O'CONNOR JOHNSON KINDNESS PLLC

(57) ABSTRACT
A self-adaptive shielding device is suitable for a lens or a window of a piece of equipment provided with an electrically conductive enclosure containing an optical or RF sensor. The device includes a shielding screen having a switchable RF shielding mesh of micrometric pitch at least partially surrounded by a border of insulator-metal transition material arranged between the mesh and an electrically conductive envelope. A susceptor element is arranged facing the insulator-metal transition material and transforms inci-
(Continued)

dent electromagnetic energy (RFH) into activation heat for the insulator-metal transition material. The susceptor element causes a transition to the conductive state of the insulator-metal transition material under the action of the electromagnetic energy so as to electrically connect the mesh to the electrically conductive envelope when the incident electromagnetic energy exceeds a given threshold.

15 Claims, 8 Drawing Sheets

(56)                References Cited

U.S. PATENT DOCUMENTS

2020/0173859  A1 *    6/2020   Dupeyrat ............... H01L 23/552
2020/0180562  A1 *    6/2020   Uprety ................... H05K 9/009

OTHER PUBLICATIONS

International Search Report mailed Feb. 22, 2023, issued in corresponding International Application No. PCT/FR2022/052048, filed Oct. 28, 2022, 5 pages.
Written Opinion mailed Feb. 22, 2023, issued in corresponding International Application No. PCT/FR2022/052048, filed Oct. 28, 2022, 5 pages.

* cited by examiner

SELF-ADAPTIVE THIN-FILM ELECTROMAGNETIC SHIELDING SCREEN

FIELD OF THE DISCLOSURE

This disclosure relates to the field of optically transparent electromagnetic shielding screens with self-adaptive electrically conductive mesh, for electromagnetic and/or optical sensor systems to be protected from intense electromagnetic radiation. In optically transparent shielding screens with self-adaptive electrically conductive mesh, the mesh is grounded to a housing incorporating at least one sensor when an electromagnetic field exceeding a certain threshold critical to the optimal operation of the sensor is detected by a protection member.

BACKGROUND

The main objective of shielding screens which protect against external electromagnetic (EM) interference is to protect vehicular optronic equipment and its optical sensors while ensuring high optical transparency within the UV (ultraviolet), visible, and IR (infrared) range, for optimal operation of the optronic equipment and of the associated optical sensors. Currently, these screens provide a pre-defined and constant value of shielding effectiveness, determined by the intrinsic parameters of the RF shielding created by a metal mesh of the screen, the mesh having a micrometric pitch, connected to a ground of the equipment.

With regard to switchable RF shielding with electrically conductive meshes, document WO2018/215243 A1 in the Applicants' name proposes a shielding screen having an electrically conductive mesh of micrometric pitch, directly printed on an internal face of lenses or windows (made of silicon, germanium, sapphire, grade B glass, etc.) of different optronic equipment items. The electrically conductive mesh of micrometric pitch is defined by the width of its electrically conductive component strips, typically on the order of 10 micrometers, its mesh pitch, typically on the order of 100 micrometers, and the thickness of the electrically conductive material used, typically on the order of 2 micrometers. Modulation of the shielding effectiveness (SE) is obtained by controlling the value of the contact impedance between this electrically conductive mesh and a ground return of the shielding screen. This control is achieved either by implanting localized components such as PIN, MEMS, NEMS, or other diodes between the electrically conductive mesh and the ground return; or by using printed strips based on insulator-metal transition materials, typically $VO_2$, whose two states, ON (electrically conductive) and OFF (electrically insulating), strongly modify the value of the contact impedance of the screen with the ground, and therefore the SE value of the screen, in a completely reversible manner.

This first solution requires a command to activate the variation in the contact impedance of the shielding and a supply of power, preferably external to the device to be protected.

Furthermore, application FR21 02339 filed on Mar. 10, 2021 by the Applicants describes a technical solution consisting of capturing the energy of external EM interference via a rectifier antenna, and using the direct current generated to activate localized components such as PIN, MEMS, NEMS, or other diodes, or printed strips based on insulator-metal transition materials, typically $VO_2$, or to activate a micropump injecting a liquid into a channel between the RF shielding and the ground, in order to dynamically adapt the SE value of the shielding screen, and thus make the RF shielding switchable. The complete system therefore becomes a shielding screen with controlled shielding effectiveness (SE), its SE value increasing automatically upon the appearance of external electromagnetic (EM) interference, without requiring activation of the system by an operator. This solution does not require a supply of power but is effective for receiving high EM energies, particularly if the means for grounding the shielding require a high current or voltage for their activation.

SUMMARY

This disclosure aims to make it even easier to implement a self-adaptive electromagnetic shielding device for the protection of a piece of equipment containing an opto-electronic sensor, and proposes an optically transparent self-adaptive electromagnetic shielding device for a lens or for a window of a piece of equipment provided with an electrically conductive enclosure containing at least one optical or RF sensor behind the lens or the window, the device comprising, on at least one face of the lens or of the window, a shielding screen comprising a switchable RF shielding mesh at least partially surrounded by a border of insulator-metal transition material arranged between the mesh and an electrically conductive envelope for shielding the piece of equipment, comprising a susceptor element, arranged facing or in contact with the insulator-metal transition material and adapted to transform incident electromagnetic energy into an amount of activation heat for the insulator-metal transition material, the susceptor element being dimensioned to cause a transition to the conductive state of the insulator-metal transition material under the action of the electromagnetic energy so as to electrically connect, at low impedance, the mesh to the electrically conductive envelope when the incident electromagnetic energy exceeds a given threshold.

This makes it possible for the self-adaptive shielding to transition automatically from a configuration allowing the passage of electromagnetic waves, to a shielding configuration which blocks the waves beyond a given incident electromagnetic energy.

The pitch of the RF shielding mesh is preferably micrometric, in order to provide active shielding at frequencies from several GHz to several tens of GHz.

The features set forth in the following paragraphs may optionally be implemented, independently of each other or in combination with each other:

According to a first embodiment, the switchable RF shielding mesh and the insulator-metal transition material are arranged on one face of the lens or of the window, internal to the piece of equipment, while the susceptor element is implemented on an external face of the lens or the window and comprises a layer of electrically conductive material which faces a surface of the insulator-metal transition material.

The insulator-metal transition material may form a first frame around the mesh, the susceptor element being shaped as a second frame facing the first frame.

In this case, a surface area of the second frame may be greater than or equal to a surface area of the first frame.

The susceptor element may comprise a layer of semi-transparent conductive material covering the external face of the lens or of the window.

According to a second embodiment, the switchable RF shielding mesh and the insulator-metal transition material are deposited on an external face of the lens or of the window, the susceptor element comprising a layer of conductive material facing a surface of the insulator-metal transition material and deposited on an electrically insulating layer covering the insulator-metal transition material.

According to a third embodiment, the switchable RF shielding mesh, the insulator-metal transition material, and the susceptor element are arranged on one face of the lens or of the window, internal or external to the piece of equipment, the susceptor element being implemented in the form of a frame surrounding the insulator-metal transition material, the latter surrounding the switchable RF shielding mesh.

According to a fourth embodiment, the switchable RF shielding mesh and the frame made of insulator-metal transition material are deposited on an external face of the lens or of the window, the susceptor element comprising a layer of conductive material, facing a surface of the insulator-metal transition material, deposited on an electrically insulating layer which in turn is covering the insulator-metal transition material. The switchable RF shielding mesh may in particular be implemented with an insulator-metal transition material deposited on an external face of the lens or of the window and covering the external face, the susceptor element comprising a layer of conductive material deposited on an insulating layer and covering it, the insulating layer itself covering the insulator-metal transition material.

The layer of conductive material and/or the layer of insulating material may in this case comprise an optically transparent mesh covering the switchable RF shielding mesh, in particular in the area of the lens or of the window facing the sensor of the system to be protected.

For all solutions, the switchable RF shielding mesh may be a mesh of micrometric pitch made of electrically conductive material, the structuring of the mesh being periodic or aperiodic (Voronoi type).

The mesh of micrometric pitch may be made of a material chosen among a titanium/silver bilayer, an insulator-metal transition material, or gold.

The insulator-metal transition material may be a $VO_2$ type of material with a thickness between 1000 nm and 2000 nm.

The susceptor element may be a gold film with a thickness of 2 nanometers to 10 nanometers.

The switchable RF shielding mesh is advantageously dimensioned to provide a shielding effectiveness of 10 dB to 40 dB within a frequency band of 0.1 GHz to 40 GHz when it is electrically connected at low impedance to the electrically conductive envelope by the insulator-metal transition material rendered electrically conductive.

The optical transparency of the shielding screen is at least 50% in the visible range, whether the shielding is active or inactive.

DESCRIPTION OF THE DRAWINGS

Other features, details, and advantages will become apparent upon reading the detailed description below, and upon analyzing the appended drawings, in which.

DETAILED DESCRIPTION

Figure 1A:
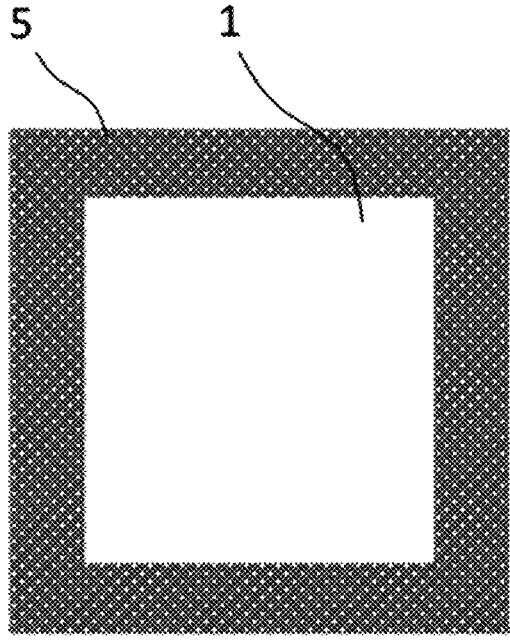
FIG. 1A shows a top view of a first embodiment of self-adaptive shielding according to this disclosure.

The objective of this disclosure is to implement a self-adaptive electromagnetic shielding screen that is optically transparent, meaning one in which the transition from a state that allows the passage of electromagnetic radiation to a state that blocks this radiation is automatic once a given incident electromagnetic energy threshold is exceeded, and returning to the optically transparent state when the electromagnetic energy falls back below the threshold. To do so, this disclosure proposes a device which comprises, as shown in FIG. 1B, a shielding screen implemented in a lens or window that is transparent to light by means of an electrically conductive micrometric mesh 2 surrounded by a frame 3 implemented as borders made of insulator-metal transition materials such as $VO_2$, $V_2O_3$, $BaVS_3$, $PrNiO_3$, $NdNiO_3$, $Fe_3O_4$, NiS, $LaCoO_3$, $SmNiO_3$, $NbO_2$, $La_{5/3}Sr_{1/3}NiO_4$, $Ti_2O_3$, GeTe, $Ge_2Sb_2Te_5$ (pure or doped materials or materials in solid solution, without this list being exhaustive) comprising a means of increasing the temperature of strips made of insulator-metal transition material forming borders constituting the frame, in the presence of external electromagnetic interference, until they are rendered electrically conductive to electromagnetic energy above a given threshold.

According to this disclosure:

a. When the borders of the insulator-metal transition material are in the electrically insulating state (OFF state), for example for a temperature $\theta_{VO2}$ that is lower than 67° C. for a material $VO_2$, the electrically conductive mesh of central micrometric pitch has high contact impedance between the perimeter of the screen and the mass of the system to be protected. The shielding effectiveness is therefore minimal;

b. When the borders of the insulator-metal transition material are in the electrically conductive state (ON state), when the temperature $\theta_{VO2}$ is greater than 67° C., the electrically conductive mesh of central micrometric pitch has low contact impedance between the perimeter of the screen and the mass of the system to be protected. The shielding effectiveness is then maximal.

The mesh is thus a switchable RF shielding mesh of micrometric pitch which is connected with low or no contact impedance to a ground of a piece of equipment, depending on the temperature of the strips of insulator-metal transition material forming the borders of the frame.

To activate the transition of the insulator-metal material, this device uses a susceptor element 5, placed facing the insulator-metal transition material or even in contact with this material, and adapted to convert incident electromagnetic energy into heat that activates the insulator-metal transition material. The susceptor element is dimensioned and positioned to cause a transition to the conductive state of the insulator-metal transition material under the action of electromagnetic energy above a given threshold, so as to electrically connect the mesh to the electrically conductive envelope, at low impedance, when the incident electromagnetic energy exceeds this given threshold.

Throughout this application, the term "facing" means that the susceptor material is aligned with the insulator-metal transition material along a direction perpendicular to the plane of the window.

Figure 1B:
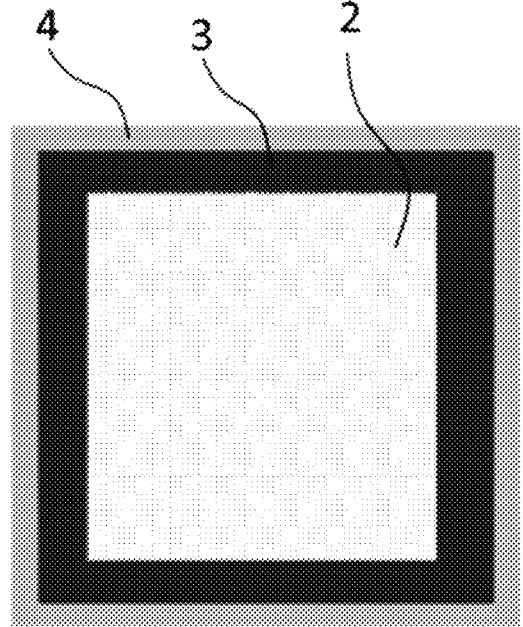
FIG. 1B shows a bottom view of the first embodiment of self-adaptive shielding according to this disclosure.

In the case of FIGS. 1A and 1B, which schematically represent a preferred solution, switchable RF shielding mesh 2 and insulator-metal transition material 3 are arranged on one face of the lens or of the window, internal to the piece of equipment, while susceptor element 5 is arranged on an external face of the lens or the window 1 and comprises a layer of conductive material forming a frame facing the surface of the frame formed by insulator-metal transition material 3. The heat generated by the susceptor element in the presence of electromagnetic energy passes through lens 1, for example a sapphire window, and heats the frame made of insulator-metal transition material which, if there is a sufficient amount of heat, transitions to the conductive state.

As an example, a test was carried out with a window composed of a sapphire substrate 0.5 mm thick and measuring 50 mm by 50 mm, on which is deposited:

a.—on the front face: a frame hollowed out at its center, made from an ultrathin layer of gold 5 nanometers thick and forming a border 7 mm wide to create susceptor material 5 around a transparent area of the window;

b.—on the rear face: a frame 3 made from a thin layer of $VO_2$ 1.5 micrometers thick forming a border 3 mm wide. The $VO_2$ frame is in contact at its outer edge with a conductive frame 4 composed of a titanium/silver (Ti/Ag) bilayer 2.5 mm wide and connecting the frame 3 to an electrically conductive envelope of the piece of equipment. The $VO_2$ frame is connected at its inner edge to a square mesh of micrometric pitch, composed of a titanium/silver (Ti/Ag) bilayer having a strip width equal to 10 micrometers, a pitch equal to 200 micrometers, and a thickness of 5 nanometers/2 micrometers and a side length equal to 40 mm, which forms switchable RF shielding mesh 2.

When the frame made of $VO_2$ material is in the electrically insulating state (OFF state at a temperature below 67° C.), the shielding effectiveness is equal to approximately 15 dB in the 2 GHz-18 GHz frequency band. When the frame made of $VO_2$ material is in the electrically conductive state (ON state at a temperature above 67° C.), then the shielding effectiveness is equal to approximately 25 dB in the 2 GHz-18 GHz frequency band. The optical transparency of the screen in the visible range (from 400 nm to 800 nm) remains greater than 77% regardless of the OFF or ON state of the frame made of $VO_2$ material.

The frame made of $VO_2$ material has, according to this example, a thickness on the order of 1000 to 2000 nanometers and preferably a thickness on the order of 1400 nanometers to 1600 nanometers, it being possible to choose a different thickness if another insulator-metal transition material is chosen.

A reverberation chamber test carried out according to the method described in the document C. L. Holloway, D. A. Hill, J. Ladbury, G. Koepke, and R. Garzia, "Shielding effectiveness measurements of materials using nested reverberation chambers," *IEEE Trans. Electromagn. Compat.*, vol. 45, no. 2, pp. 350-356, May 2003. doi: 10.1109/TEMC.2003.809117, allowed demonstrating experimentally that ultrathin layers of gold (5 nm to 10 nm thick) subjected to electromagnetic stress over a frequency band of 2.7 GHz to 3.2 GHz and at a power of 55 W at the amplifier output make it possible to increase the temperature of the sapphire substrate from a value of 22° C. to a value greater than 110° C.

Figure 1C:
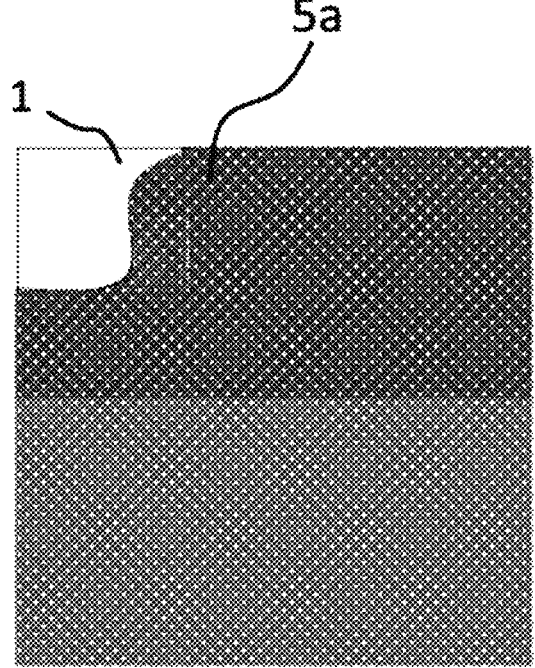
FIG. 1C shows a top view of a variant of FIG. 1A.
Figure 2:
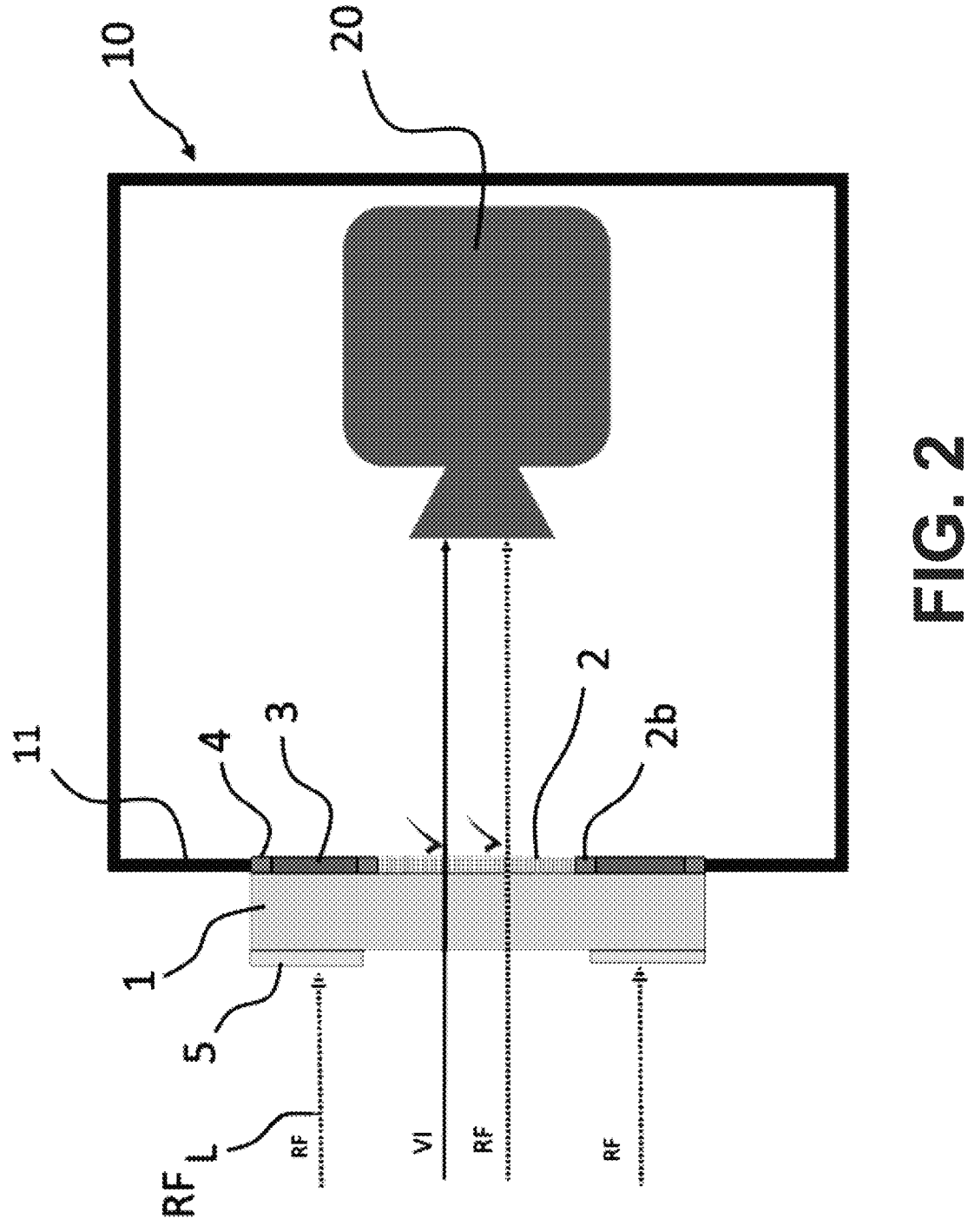
FIG. 2 shows a schematic view of a sensor device behind a window comprising self-adapting shielding, under low electromagnetic stress.
Figure 3:
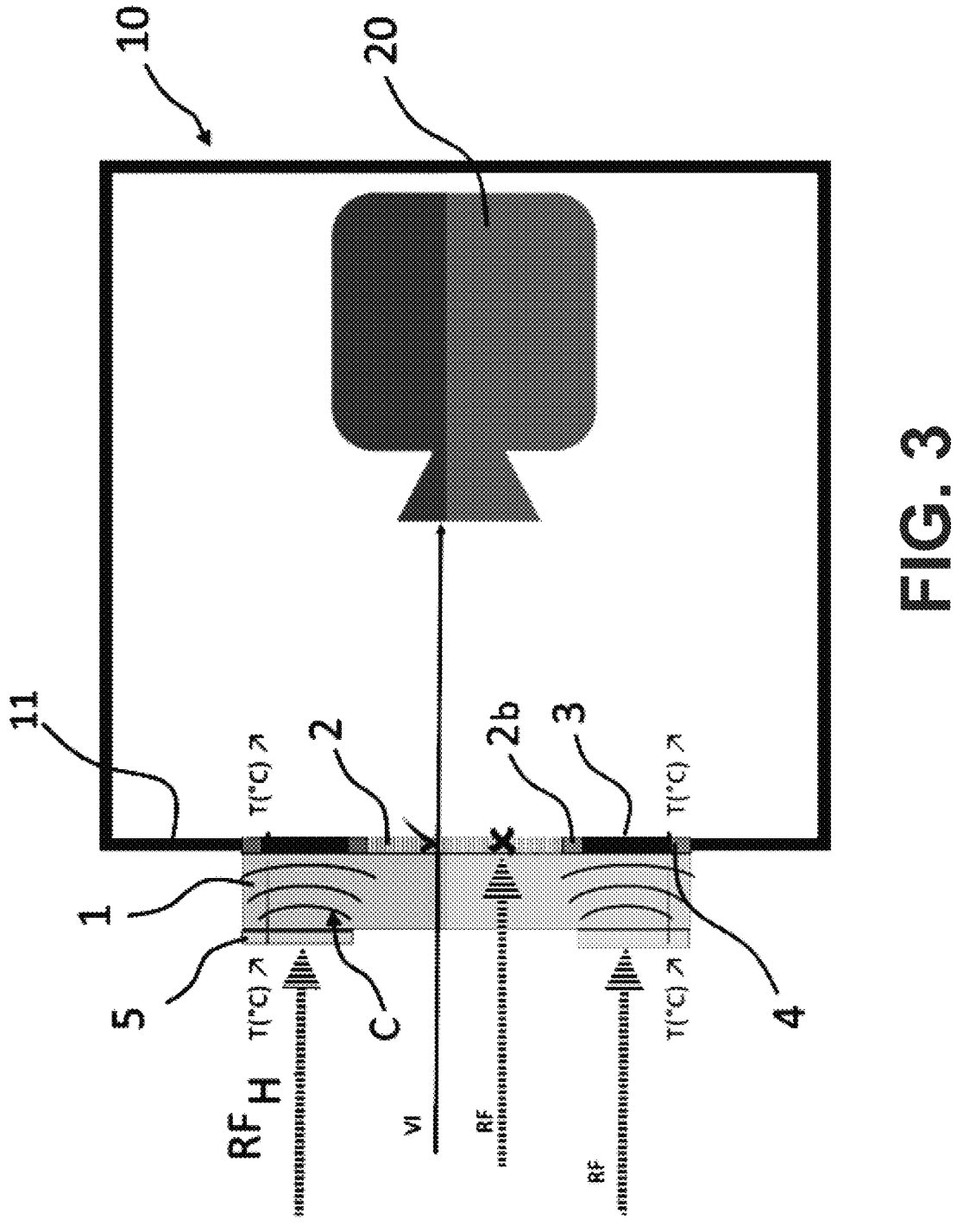
FIG. 3 shows a schematic view of the device of FIG. 2 under high electromagnetic stress according to this disclosure.

FIGS. 2 and 3 schematically illustrate a piece of equipment comprising an electrically conductive enclosure, in this case a metal enclosure 10 containing an optical or RF sensor 20 facing a lens or window 1 bearing the shielding device as described in FIGS. 1 and 2 and in which the insulator-metal transition material is for example the material $VO_2$.

Metal enclosure 10 is provided with a metal envelope 11 for sapphire window 1 and is electrically connected to conductive frame 4 which surrounds frame 3 made of $VO_2$ material. This frame surrounds switchable RF shielding mesh 2 which itself is provided here with a border 2b for electrically connecting to the $VO_2$ frame on the internal face of the window.

In the configuration of FIG. 2, low-energy radiation $RF_L$ irradiates the external face of the window and the frame 5 forming the susceptor element. In this configuration, the temperature of the insulator-metal transition material remains low and the material remains an electrical insulator.

RF signals and ultraviolet, visible, and infrared light signals VI pass through the window and are received by sensor 20.

In FIG. 3, high-energy signals RFH irradiate the susceptor element and its temperature rises. The amount of heat C created is transmitted through the window to the insulator-metal transition material, and the temperature of the material increases until it reaches transition temperature if the energy of the electromagnetic radiation is sufficient. Once the transition temperature is reached, the insulator-metal transition material becomes conductive, which allows an electrical contact of low impedance between mesh 2 and enclosure 10 and blocks the RF signals, while the ultraviolet, visible, and infrared light signals VI can still reach sensor 20.

FIG. 1C corresponds to a variant of FIG. 1A, in which the external face of the sapphire substrate forming window 1 is entirely covered with an ultrathin thin layer of susceptor material 5a, for example a layer of gold 2 to 10 nanometers and preferably 4 to 6 nanometers thick for a thin window as described above, while the internal face of the window remains in the same configuration as in FIG. 1B. This embodiment increases the electromagnetic energy captured by the screen when it is subjected to external electromagnetic interference, and therefore reduces the electromagnetic energy required to obtain a temperature increase sufficient to cause the conductive transition of the insulator-metal material. However, this embodiment reduces the optical transparency of the shielding, the maximum optical transparency of a thin layer of gold 5 nanometers thick on sapphire being close to 50% in the visible range.

In the case where the insulator-metal transition material is a material other than $VO_2$, or depending on the energy of the RF signal for which we desire to trigger the transition, it is possible to increase or reduce the surface area covered by the susceptor element.

Figure 4A:
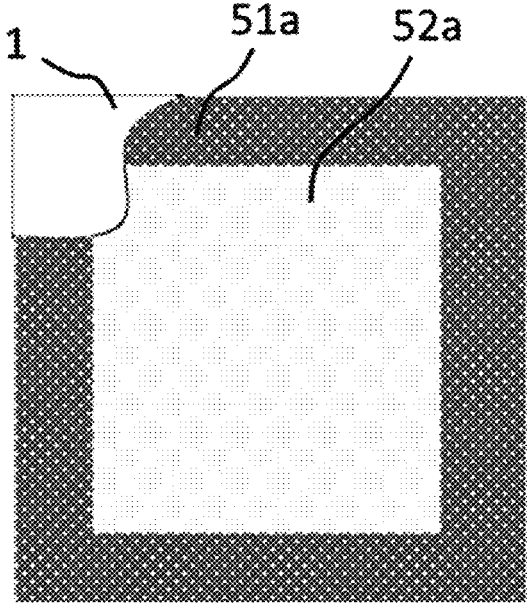
FIG. 4A is a top view of a second embodiment of self-adaptive shielding according to this disclosure.
Figure 4B:
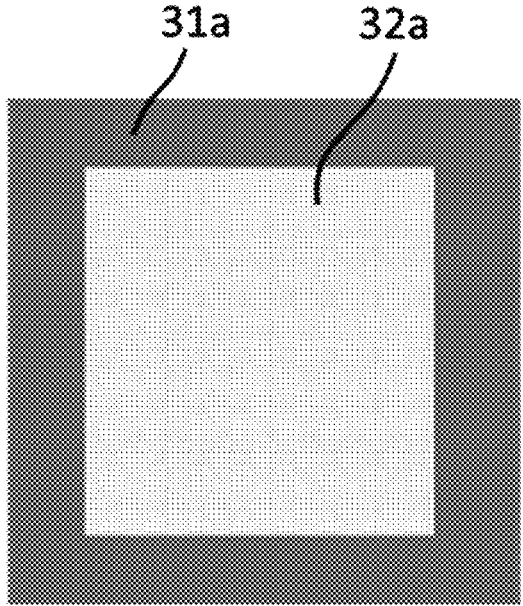
FIG. 4B is a bottom view of the exemplary embodiment of self-adaptive shielding of FIG. 4A.
Figure 4C:
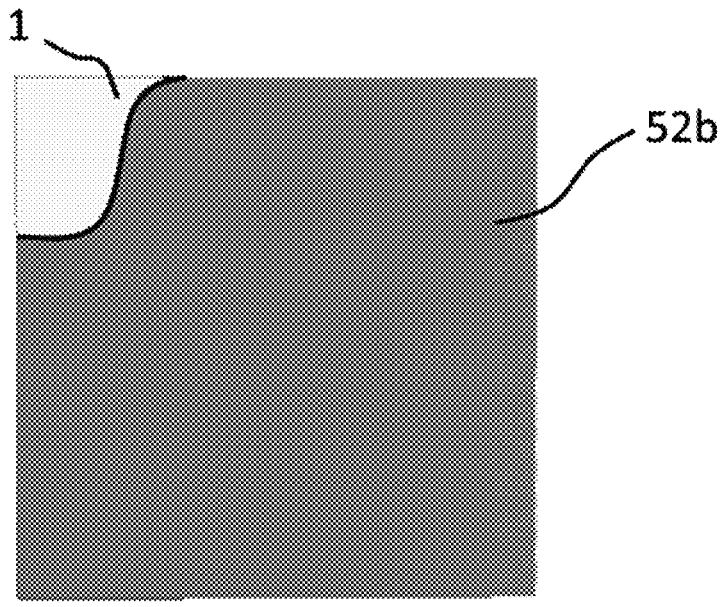
FIG. 4C is a top view of a variant of the self-adaptive shielding of FIG. 4A.

FIGS. 4A, 4B, and 4C are other variants with an electrically conductive mesh of micrometric pitch 32a made entirely of insulator-metal transition material on the rear face of sapphire substrate 1 surrounded by a frame 31a for the connection to electrically conductive envelope 11 of FIG. 2 which itself is made of insulator-metal transition material, for example $VO_2$ or some other insulator-metal transition material as stated above. A fairly low shielding effectiveness is obtained when the $VO_2$ material is in the electrically conductive state, approximately 10 dB in the 2 GHz-18 GHz band, because its electrical conductivity ($\sigma$=approximately $3 \times 10^5$ S/m) is lower than that of silver ($\sigma$=$6.1 \times 10^7$ S/m). However, the manufacturing process is simplified due to the absence of the meshed Ti/Ag bilayer of micrometric pitch. For the external face, FIG. 4A shows a frame 51a formed by an ultrathin layer of gold with a thickness of 4 to 6 nanometers and an internal portion of the frame formed by an ultrathin layer of meshed gold 52a. In the case of a window 1 of small surface area, the ultrathin layer of meshed gold 52a may be eliminated, frame 51a being sufficient to provide the amount of heat required for the insulator-metal transition of mesh 32a and the frame 31a made of $VO_2$ material. 4C shows covering the entire external face of window 1 with a continuous ultrathin layer of gold 52b which ensures a better increase in the temperature of window 1 but at the expense of optical transparency.

Figure 5A:
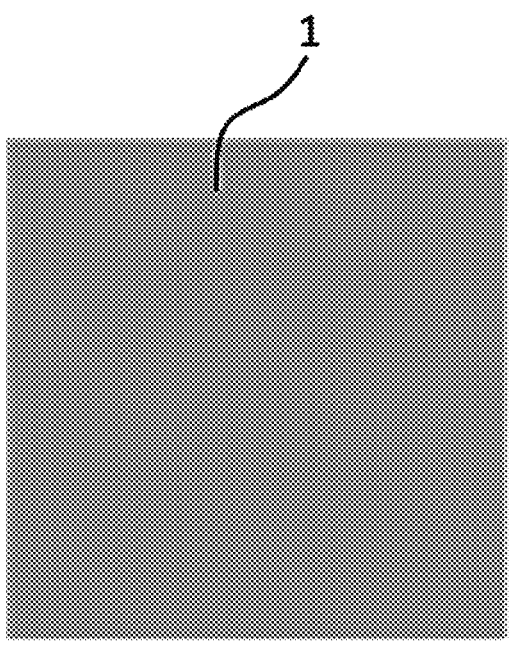
FIG. 5A is a top view of a third embodiment of self-adaptive shielding according to this disclosure.
Figure 5B:
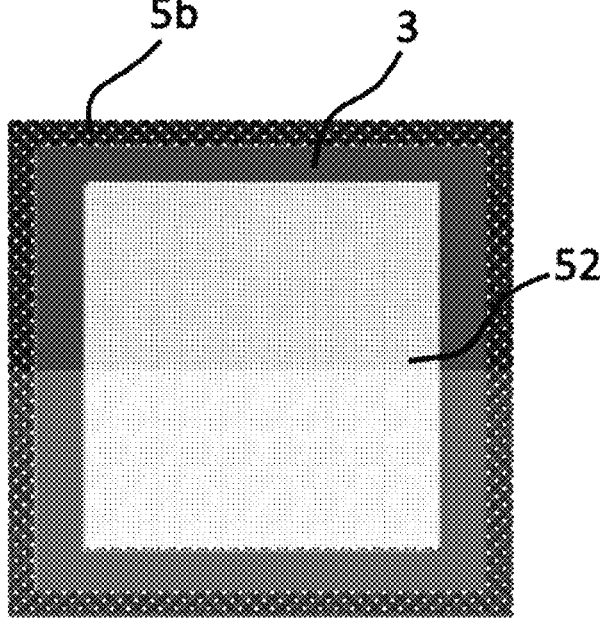
FIG. 5B is a bottom view of the exemplary embodiment of self-adaptive shielding of FIG. 5A.

The exemplary embodiment of FIGS. 5A and 5B replaces the mesh made of Ti/Ag bilayer, with an ultrathin mesh 52 of micrometric pitch made of gold approximately 5 nanometers thick. The electrically conductive frame surrounding frame 3 of $VO_2$ material is replaced by a gold frame to create a susceptor material directly in electrical contact with the $VO_2$ frame. This simplifies the manufacture of the screen and leaves the external face of window 1 bare. However, the shielding effectiveness of such an ultrathin layer of gold, approximately 30 dB in the 2 GHz-18 GHz band, is lower than that of the meshed Ti/Ag layer of micrometric pitch having a thickness of 5 nm/2 μm, which is on the order of approximately 30 to 40 dB in the 2 GHz-18 GHz band.

Figure 6B:
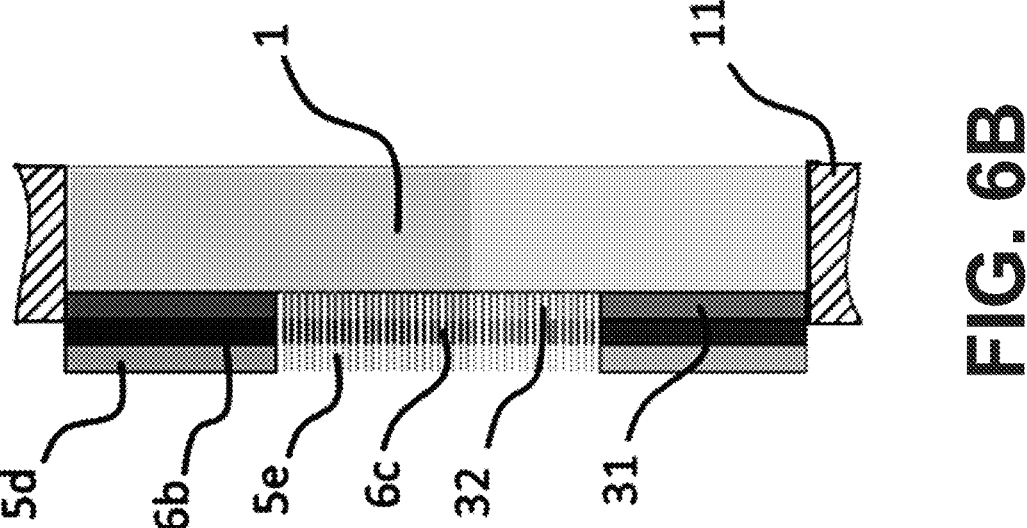
FIG. 6B is a side view of a variant of the self-adaptive shielding of FIG. 6A.
Figure 6A:
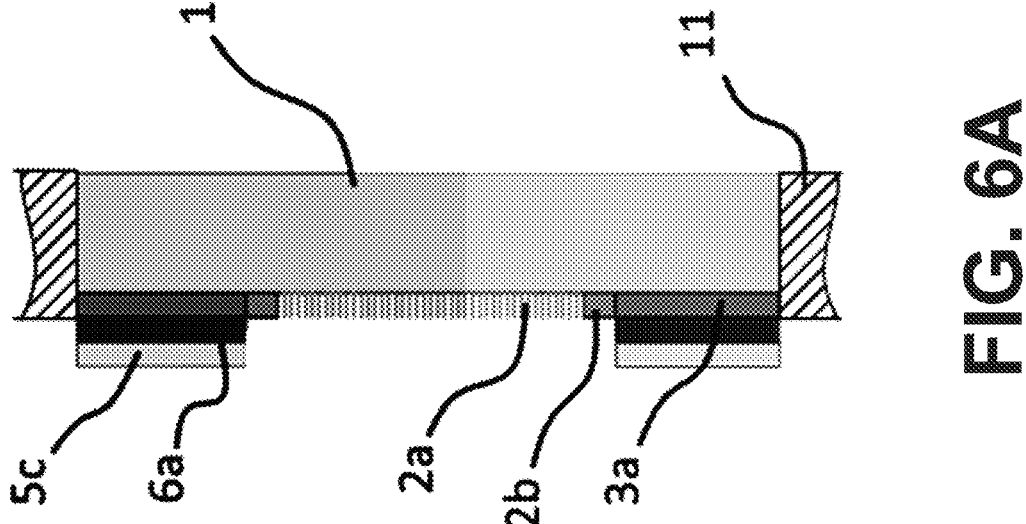
FIG. 6A is a side view of a fourth embodiment of self-adaptive shielding according to this disclosure.

FIGS. 6A and 6B are variants where only the external face of window 1 is structured. These embodiments are based on a stack on the external face of the window, of a first frame comprising a susceptor material 5c, 5d, a frame of insulating electrical material 6a, 6b such as $TiO_2$ or $Al_2O_3$ a hundred nanometers thick, and a frame of insulator-metal transition material 3a, 31 around a conductive mesh 2a, or of insulator-metal transition material 32. In the case of FIG. 6A where the mesh is a Ti/Ag mesh as in FIG. 1, the performances in terms of shielding effectiveness and optical transparency of the screen are preserved, but with the addition of an improvement in the switching speed between the ON and OFF states, because the amount of heat generated by the layer of susceptor material during external EM interference only has to pass through the thin layer of $TiO_2$ or $Al_2O_3$, and no longer through the window, which is much thicker.

The manufacture of these variants is nevertheless more complex due to the need to use a new dielectric buffer layer 6a, 6b having high thermal conductivity, for example made of $TiO_2$ or $Al_2O_3$ material having a thickness on the order of 100 nanometers for example. This buffer dielectric layer of $TiO_2$ or $Al_2O_3$ must be interposed between the ultrathin gold layer and the $VO_2$ layer. When the ultrathin gold layer converts the energy of the electromagnetic wave into an amount of heat, this heat is transferred to the thin $VO_2$ layer through the buffer layer and causes the insulator-metal transition of the $VO_2$ material. However, this gold layer must remain electrically insulated from the $VO_2$ layer, so that it retains all its susceptor capabilities.

In the case of FIG. 6B, the Ti/Ag mesh is replaced by a $VO_2$ mesh 32 connected to the $VO_2$ frame 31 and the insulating and gold layers are themselves provided with respective meshes 6c and 5e.

This disclosure is not limited to the examples described above only by way of example, but encompasses all variants conceivable to those skilled in the art within the context of the protection sought. In particular, the various solutions described may be combined, such as the solution of FIGS. 5A and 5B in particular for which the gold mesh may be replaced by a Ti/Ag mesh from the solution in FIG. 1B. Similarly, the thicknesses and lateral dimensions described above are merely indicative and may vary depending on the energy level of the electromagnetic radiation for which self-adaptation of the shielding is desired and the dimensions of the window.

The frequency range of the protection sought against external EM interferences, based on the electrically conductive mesh of micrometric pitch of this disclosure, covers the 0.1 GHz to 40 GHz band. A mesh pitch that is millimetric or even centimetric in size could also be considered, but at the expense of the high frequency of the protection of the shielding screen.

The disclosure is not limited to the examples described above, and, in particular, other combinations are possible for the placement of the materials as long as the susceptor material is positioned to allow it to heat, in the presence of a given electromagnetic energy, the insulator-metal transition material which itself is positioned to allow the switchable RF shielding to be connected to an electrically conductive envelope of a lens or a window. It is also possible, in the context of this disclosure, to substitute the film or ultrathin layer of gold used as a susceptor, with a layer of graphite, stainless steel, molybdenum, or silicon carbide, or even aluminum, without this list being exhaustive. It is also possible in the context of this disclosure to replace the metal mesh with a continuous or meshed thin layer of material belonging to the family of transparent conductive oxides (TCO) such as pure or doped $In_2O_3$ (ITO, FTO, etc.), pure or doped ZnO (AZO, etc.), without this list being exhaustive.

The invention claimed is:

1. An optically transparent self-adaptive electromagnetic shielding device for a lens or for a window of a piece of equipment provided with an electrically conductive enclosure containing an optical or RF sensor behind said lens or said window, said shielding device comprising, on at least one face of said lens or said window, a shielding screen comprising a switchable RF shielding mesh at least partially surrounded by a border of insulator-metal transition material arranged between said mesh and an electrically conductive envelope for shielding said piece of equipment, said shielding device further comprising a susceptor element, arranged facing or in contact with said insulator-metal transition material and adapted to transform incident electromagnetic energy into an amount of activation heat for said insulator-metal transition material, said susceptor element being dimensioned to cause a transition to a conductive state of said insulator-metal transition material under the action of said electromagnetic energy so as to electrically connect, at low impedance, said mesh to said electrically conductive envelope when the incident electromagnetic energy exceeds a predetermined threshold.

2. The self-adaptive shielding device according to claim 1, wherein the switchable RF shielding mesh and the insulator-metal transition material are arranged on one face of said lens or of said window, internal to the piece of equipment, while the susceptor element is implemented on an external face of said lens or of said window and comprises a layer of electrically conductive material which faces a surface of said insulator-metal transition material.

3. The self-adaptive shielding device according to claim 2, wherein the insulator-metal transition material forms a first frame around the mesh, the susceptor element being shaped as a second frame facing said first frame.

4. The self-adaptive shielding device according to claim 3, wherein a surface area of the second frame is greater than or equal to a surface area of the first frame.

5. The self-adaptive shielding device according to claim 2, wherein the susceptor element comprises a layer of semi-transparent conductive material covering the external face of said lens or of said window.

6. The self-adaptive shielding device according to claim 1, wherein the switchable RF shielding mesh and the insulator-metal transition material are deposited on an external face of said lens or of said window, the susceptor element comprising a layer of conductive material facing a surface of said insulator-metal transition material and deposited on an electrically insulating layer covering said insulator-metal transition material.

7. The self-adaptive shielding device according to claim 6, wherein the switchable RF shielding mesh is implemented with the insulator-metal transition material deposited on an external face of said lens or of said window and covering said external face, the susceptor element comprising a layer of conductive material deposited on an insulating layer which itself covers said insulator-metal transition material.

8. The self-adaptive shielding device according to claim 7, wherein said layer of conductive material and/or said layer of insulating material comprises an optically transparent mesh covering the switchable RF shielding mesh.

9. The shielding device according to claim 1, wherein the switchable RF shielding mesh, the insulator-metal transition material, and the susceptor element are arranged on one face of said lens or of said window, internal or external to the piece of equipment, the susceptor element being implemented in the form of a frame surrounding the insulator-metal transition material, the latter surrounding the switchable RF shielding mesh.

10. The self-adaptive shielding device according to claim 1, wherein the switchable RF shielding mesh is a mesh of micrometric pitch made of electrically conductive material.

11. The self-adaptive shielding device according to claim 1, wherein the switchable RF shielding mesh is a mesh made of a material chosen among a titanium/silver bilayer, an insulator-metal transition material, or gold.

12. The self-adaptive shielding device according to claim 1, wherein the insulator-metal transition material is a VO2 type of material with a thickness between 1000 and 2000 nm.

13. The self-adaptive shielding device according to claim 1, wherein the susceptor element is a gold film with a thickness of 2 nanometers to 10 nanometers.

14. The self-adaptive shielding device according to claim 1, wherein the switchable RF shielding mesh is dimensioned to provide a shielding effectiveness of 10 dB to 40 dB within a frequency band of 0.1 GHz to 40 GHz when the mesh is electrically connected at low impedance to the electrically conductive envelope by the insulator-metal transition material rendered conductive.

15. The self-adaptive shielding device according to claim 1, wherein an optical transparency of the shielding screen is at least 50% in the visible range.

* * * * *